(12) United States Patent
Kotani (10) Patent No.: US 7,119,408 B2
(45) Date of Patent: Oct. 10, 2006

(54) SEMICONDUCTOR DEVICE AND METHOD FOR FABRICATING THE SAME

(75) Inventor: Naoki Kotani, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/074,674

(22) Filed: Mar. 9, 2005

(65) Prior Publication Data

US 2005/0224872 A1    Oct. 13, 2005

(30) Foreign Application Priority Data

Apr. 13, 2004    (JP) .............................. 2004-118247

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ............... 257/408; 257/336; 257/E29.278; 257/E21.435; 257/344

(58) Field of Classification Search ............... 438/306, 438/307; 257/336, 335, 408, 344, 640, E29.278, 257/E21.435

See application file for complete search history.

(56) References Cited

U.S. PATENT DOCUMENTS 6,232,187 B1 * 5/2001 Kuroi et al. ................ 438/287
6,437,406 B1 * 8/2002 Lee .......................... 257/349
6,576,965 B1 * 6/2003 Eikyu et al. ................ 257/408
2003/0075765 A1 * 4/2003 Ohnakado et al. .......... 257/393

FOREIGN PATENT DOCUMENTS

JP      09-064362       3/1997

* cited by examiner

Primary Examiner—Evan Pert
Assistant Examiner—Victor A. Mandala, Jr.
(74) Attorney, Agent, or Firm—McDermott Will & Emery LLP (57) ABSTRACT

A semiconductor device of the present invention includes, as a peripheral MIS transistor 25b, a gate insulating film 13b and a gate electrode 14b provided above an active region 10b, first and second sidewalls 19b and 23b provided on side surfaces of the gate electrode 14b, n-type source and drain regions 24b provided away from each other in the active region, nitrogen diffusion layers 18 provided below the outer sides of the gate electrode 14b, n-type extension regions 16 containing arsenic and provided in regions of the active region 10b located below the outer sides of the gate electrode 14b so that the n-type extension regions 16 cover the inner side surfaces and the bottom surfaces of the nitrogen diffusion layers 18, respectively, and n-type dopant regions 17 containing phosphorus and provided in regions of the active region 10b located below the outer sides of the gate electrode 14b and deeper than the n-type extension regions 16.

18 Claims, 5 Drawing Sheets

SEMICONDUCTOR DEVICE AND METHOD FOR FABRICATING THE SAME

CROSS-REFERENCE TO RELATED APPLICATIONS

This application claims priority under 35 U.S.C. § 119 on Patent Application No. 2004-118247 filed in Japan on Apr. 13, 2004, the entire contents of which are hereby incorporated by reference.

BACKGROUND OF THE INVENTION (a) Fields of the Invention

The present invention relates to semiconductor devices and methods for fabricating the same.

(b) Description of Related Art

In a recent semiconductor device field, speed enhancement and power consumption reduction of semiconductor devices due to rapid miniaturization of the devices have proceeded. Accompanied with such a trend, gate insulating films of transistors in the devices have become thinner, and diffusion profiles therein have been changed considerably. This makes it difficult to ensure the reliability of the device.

FIGS. 5A to 5E are sectional views showing steps of a conventional fabrication method of a semiconductor device. In FIGS. 5A to 5E, an n-channel MIS transistor for an internal circuit (internal MIS Tr) is formed in an internal circuit area AreaA illustrated in the left halves of these figures, and an n-channel MIS transistor for a peripheral circuit (peripheral MIS Tr) is formed in a peripheral circuit area AreaB illustrated in the right halves of these figures.

Figure 5A:
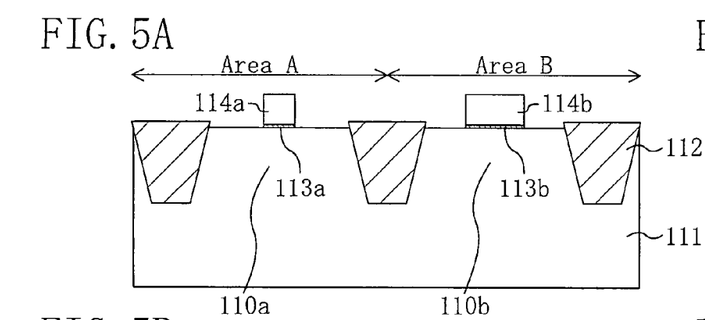
FIGS. 5A to 5E are sectional views showing process steps of a conventional method for fabricating a semiconductor device.

In the conventional fabrication method of a semiconductor device, first, in the step shown in FIG. 5A, in a p-type semiconductor region (referring to part of a semiconductor substrate) 111, regions surrounding an active region 110a and an active region 110b are formed with isolation regions 112, respectively, by a normal shallow trench isolation process. Thereafter, a gate insulating film 113a and a gate electrode 114a are formed above the active region 110a of the internal circuit area AreaA, and a gate insulating film 113b and a gate electrode 114b are formed above the active region 110b of the peripheral circuit area AreaB.

Figure 5B:
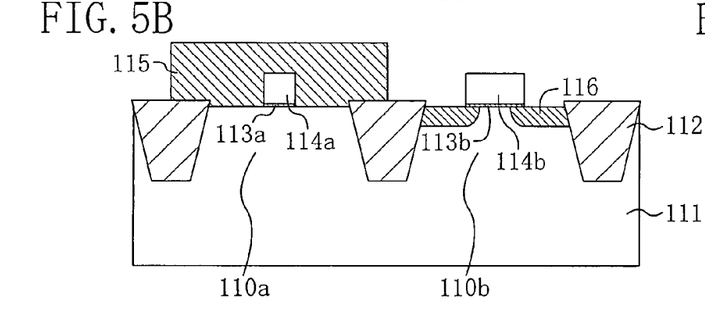

Next, in the step shown in FIG. 5B, on a substrate, an implantation mask 115 of photoresist is formed which covers the internal circuit area AreaA and has an opening in the peripheral circuit area AreaB. Thereafter, with the implantation mask 115 covering the internal circuit area AreaA, arsenic ions serving as an n-type dopant are implanted using the gate electrode 114b as a mask to form n-type extension regions 116 in regions of the active region 110b of the peripheral circuit area AreaB located below both sides of the gate electrode 114b, respectively.

Figure 5C:
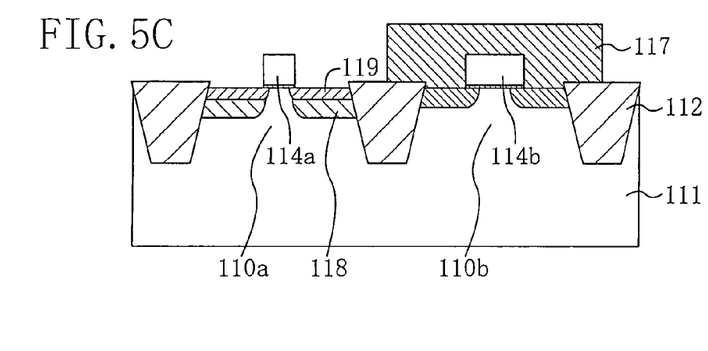

Subsequently, in the step shown in FIG. 5C, the implantation mask 115 is removed, and an implantation mask 117 of photoresist is formed which covers the peripheral circuit area AreaB and has an opening exposing the internal circuit area AreaA. Thereafter, with the implantation mask 117 covering the peripheral circuit area AreaB, arsenic ions serving as an n-type dopant are implanted using the gate electrode 114a as a mask to form n-type extension regions 119 in regions of the active region 110a of the internal circuit area AreaA located below both sides of the gate electrode 114a, respectively. While the implantation mask 117 used in the formation of the n-type extension regions 119 is left remaining, boron ions as a p-type dopant are implanted using the gate electrode 114a as a mask to form p-type pocket regions 118 in the active region 110a of the internal circuit area AreaA.

Figure 5D:
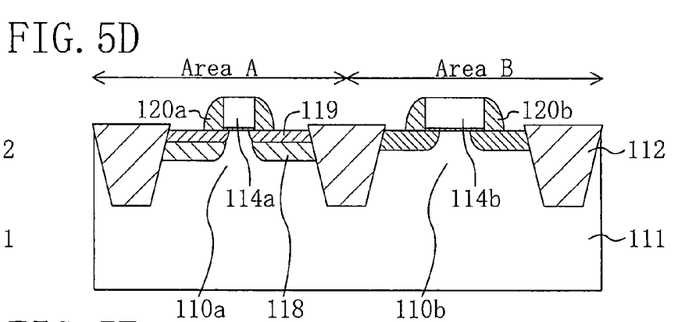

Next, in the step shown in FIG. 5D, the implantation mask 117 is removed, and an insulating film (not shown) covering top and side surfaces of the gate electrodes 114a and 114b is formed on the substrate. Thereafter, the insulating film is etched back to form insulating sidewalls 120a on the side surfaces of the gate electrode 114a of the internal circuit area AreaA and insulating sidewalls 120b on the side surfaces of the gate electrode 114b of the peripheral circuit area AreaB.

Figure 5E:
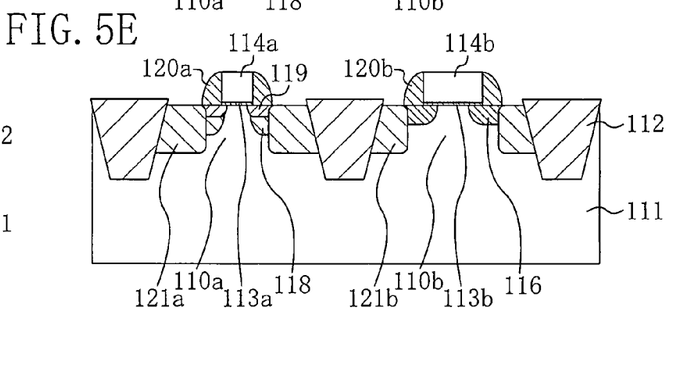

Then, in the step shown in FIG. 5E, ion implantation of an n-type dopant is conducted using the gate electrode 114a, the insulating sidewalls 120a, the gate electrode 114b, and the insulating sidewalls 120b as a mask, thereby forming n-type source and drain regions 121a in the active region 110a of the internal circuit area AreaA and n-type source and drain regions 121b in the active region 110b of the peripheral circuit area AreaB.

In past years, a gate insulating film of a MIS transistor was sufficiently thick, so that the hot carrier lifetime which is important as the reliability of the MIS transistor was able to be ensured easily. In addition, source and drain regions thereof were formed without complication by forming a gate electrode, implanting arsenic ions, phosphorus ions, or the both ions using the gate electrode as a mask, and then performing annealing. However, since, in recent years, rapid miniaturization of the semiconductor devices has proceeded, the gate insulating film has been thinned and the dopant concentrations of source and drain required to ensure current have been increased, resulting in a rise in the electric field intensity of a channel in the device. Therefore, in the structure of the device as described above, hot carriers are likely to occur around the edge of the drain, and thus the reliability of the transistor is disadvantageously lowered.

To solve this disadvantage, a method for improving hot carrier resistance by nitrogen ion implantation has been studied. For example, Japanese Unexamined Patent Publication No. H09-64362 proposes a method for improving resistance to hot carrier degradation. In this method, a gate oxide film and a gate electrode of polysilicon are formed above a semiconductor substrate, and then nitrogen ions are implanted by oblique rotating ion implantation to change portions of the gate oxide film immediately below edges of the gate electrode to nitrided oxide films (oxynitride films). A subsequent ion implantation forms source and drain regions in the semiconductor substrate, thereby improving resistance to hot carrier degradation.

Japanese Unexamined Patent Publication No. H09-64362 also proposes another method for improving resistance to hot carrier degradation. In this method, a silicon oxide film is formed on the entire surface of a semiconductor region with a gate oxide film and a gate electrode provided thereabove, and then nitrogen ions are implanted on the condition in which the peak of the implantation profile appears around the interface between the silicon oxide film and the silicon substrate. The resulting silicon oxide film is etched back to form sidewalls on side surfaces of the gate electrode, and a subsequent ion implantation forms source and drain regions in the semiconductor region, thereby improving resistance to hot carrier degradation.

However, even the methods mentioned above cannot fully deal with rapid miniaturization of semiconductor devices. As a consequence, it is increasingly difficult to ensure a sufficient hot carrier lifetime of the device. In addition, when nitrogen is directly implanted into the gate oxide film as shown in the method proposed by Japanese Unexamined Patent Publication No. H09-64362, the reliability of the oxide film itself is disadvantageously lowered.

SUMMARY OF THE INVENTION

With the foregoing disadvantages in mind, an object of the present invention is to provide a highly reliable semiconductor device capable of ensuring a sufficient hot carrier lifetime, and to provide a fabrication method of such a device.

A semiconductor device of the present invention is a semiconductor device having a first MIS transistor provided in a semiconductor layer. In this device, the first MIS transistor comprises: a first gate insulating film provided on the semiconductor layer; a first gate electrode provided on the first gate insulating film; first extension regions containing a first dopant of a first conductivity type and provided in regions of the semiconductor layer located below sides of the first gate electrode, respectively; dopant regions containing a second dopant of the first conductivity type and provided in regions of the semiconductor layer located below the sides of the first gate electrode and deeper than the first extension region, respectively; and nitrogen diffusion layers provided on the first extension regions and in an upper surface portion of the semiconductor layer, respectively.

With this device, not only the nitrogen diffusion layer can suppress the occurrence of hot carriers, but also the dopant region can smooth a pn junction in a portion of the active region of the first MIS transistor located below the first gate electrode, which also suppresses the occurrence of hot carriers.

Preferably, in the semiconductor device, in the nitrogen diffusion layers, their entire bottom surface and their side surface closer to the first gate electrode are surrounded by the first extension region and located within surface boundaries thereof, respectively. In this case, drawbacks caused by diffusion of nitrogen into another region can be prevented.

The semiconductor device may further comprise: a sidewall provided on each side surface of the first gate electrode; and source and drain regions containing a third dopant of the first conductivity type and each provided in a region of the semiconductor layer located below a corresponding side of the sidewall (below the side of the sidewall positioned in the opposite direction to the direction from the sidewall toward the first gate electrode), and the nitrogen diffusion layers may each be provided in a region of the upper surface portion of the semiconductor layer located below the sidewall.

The sidewalls may comprise a first sidewall provided on a corresponding side surface of the first gate electrode; and a second sidewall provided to the corresponding side surface of the first gate electrode with the first sidewall interposed therebetween.

The first dopant may be arsenic, and the second dopant may be phosphorus. In this case, by implanting nitrogen for the nitrogen diffusion layer after implantation of arsenic and phosphorus, the peak concentration and the overall concentration of nitrogen can be raised in the nitrogen diffusion layer.

In the semiconductor device, a second MIS transistor may be provided in a region of the semiconductor layer differing from the region where the first MIS transistor is provided, and the second MIS transistor may comprise: a second gate insulating film provided on the semiconductor layer; a second gate electrode provided on the second gate insulating film; second extension regions containing a fourth dopant of the first conductivity type and provided in regions of the semiconductor layer located below sides of the second gate electrode, respectively; and pocket regions containing a dopant of a second conductivity type and provided in regions of the semiconductor layer located below the sides of the second gate electrode and deeper than the second extension regions, respectively. In addition, if the second MIS transistor is included in an internal circuit and the first MIS transistor is included in a peripheral circuit area, the present invention can be effectively utilized in the peripheral circuit area having a high source voltage and an easily-degradable hot carrier lifetime.

The second MIS transistor may further comprise: a third sidewall of plate shape provided on a corresponding side surface of the second gate electrode; a fourth sidewall provided to the corresponding side surface of the second gate electrode with the third sidewall interposed therebetween; and second source and drain regions containing a fifth dopant of the first conductivity type and each provided in a region of the semiconductor layer located below a corresponding side of the fourth sidewall.

If the second MIS transistor has no layer containing nitrogen on the second extension regions, the second MIS transistor can operate without any influences of nitrogen.

A method for fabricating a semiconductor device according to the present invention comprises: the step (a) of forming a first gate insulating film on a semiconductor layer; the step (b) of forming, after the step (a), a first gate electrode on the first gate insulating film; the step (c) of conducting, after the step (b), ion implantation of a first dopant of a first conductivity type to form first extension regions of the first conductivity type in regions of the semiconductor layer located below sides of the first gate electrode, respectively, the ion implantation being made using the first gate electrode as a mask and from an oblique direction (of oblique directions, not the direction away from the first gate electrode but the direction close to the first gate electrode) relative to an upper surface of the semiconductor layer; the step (d) of conducting, after the step (b), ion implantation of a second dopant of the first conductivity type to form dopant regions of the first conductivity type in regions of the semiconductor layer located below the sides of the first gate electrode and deeper than the first extension regions, respectively, the ion implantation being made using the first gate electrode as a mask and from an oblique direction relative to the upper surface of the semiconductor layer; and the step (e) of conducting, after the steps (c) and (d), ion implantation of nitrogen to form nitrogen diffusion layers in upper surface portions of the first extension regions, respectively, the ion implantation being made using the first gate electrode as a mask so that the angle of implantation relative to the normal to the surface of the semiconductor layer is smaller than with the ion implantations of the first dopant and the second dopant.

With this method, since nitrogen for the nitrogen diffusion layer is implanted into the semiconductor layer after implantations of dopants for the first extension region and the dopant region, the peak concentration and the overall concentration of nitrogen can be raised in the nitrogen diffusion layer. Thus, the peak concentration of nitrogen can be raised without increasing the amount of nitrogen to be implanted into the semiconductor layer, so that the occurrence of hot carriers can be suppressed more without increasing influences of nitrogen on the element or the like. Moreover, provision of the dopant region can smooth a pn junction in a portion of the active region located below the first gate electrode, which further suppresses the occurrence of hot carriers.

If, in the step (e), ion implantation of nitrogen is conducted from a vertical direction to the upper surface of the semiconductor layer, the nitrogen diffusion layer can be certainly made contained within the surface boundary of the first extension region and the dopant region.

Preferably, in the step (e), the ion implantation is conducted so that a bottom surface of the nitrogen diffusion layer and a side surface thereof closer to the first gate electrode are surrounded by the first extension region and located within surface boundaries thereof, respectively. In this case, drawbacks caused by diffusion of nitrogen into another region can be prevented.

Preferably, in the step (c), ion implantation is conducted with arsenic as the first dopant, and in the step (d), ion implantation is conducted with phosphorus as the second dopant. In this case, by implanting nitrogen after implantations of arsenic and phosphorus, the peak concentration and the overall concentration of nitrogen can be raised as compared to the case where these implantations are conducted in reverse order.

The method for fabricating a semiconductor device may further comprise: the step (f) of forming, after the step (e), a first sidewall on each side surface of the first gate electrode; the step (g) of forming, after the step (f), a second sidewall on the outer surface of the first sidewall; and the step (h) of conducting, after the step (g), ion implantation of a third dopant of the first conductivity type using the first gate electrode, the first sidewall, and the second sidewall as a mask, thereby forming first source and drain regions of the first conductivity type each in a region of the semiconductor layer located below a corresponding side of the second sidewall (below the side of the second sidewall positioned in the opposite direction to the direction from the second sidewall toward the first gate electrode).

In the step (a), a second gate insulating film may be formed on a region of the semiconductor layer differing from the region where the first gate insulating film is formed, in the step (b), a second gate electrode may be formed on the second gate insulating film, in the step (f), a third sidewall may be formed on each side surface of the second gate electrode, and the method may further comprise the steps of: conducting, after the step (f) and before the step (g), ion implantation of a fourth dopant of the first conductivity type to form second extension regions of the first conductivity type each in a region of the semiconductor layer located below a corresponding side of the third sidewall, the ion implantation being made using the second gate electrode and the third sidewall as a mask and from a vertical direction to the upper surface of the semiconductor layer; and conducting, after the step (f) and before the step (g), ion implantation of a dopant of a second conductivity type to form pocket regions of the second conductivity type each in a region of the semiconductor layer located below the side of the third sidewall and deeper than the second extension region, the ion implantation being made using the second gate electrode and the third sidewall as a mask and from an oblique direction relative to the upper surface of the semiconductor layer.

If, in the above case, the first gate electrode is a gate electrode in a peripheral circuit area, and the second gate electrode is a gate electrode in an internal circuit area, the present invention can be effectively utilized in the peripheral circuit area having a high source voltage and an easily-degradable hot carrier lifetime.

In the step (g), a fourth sidewall may be formed on the outer side surface of the third sidewall, and in the step (h), ion implantation of a fifth dopant of the first conductivity type may be conducted using the second gate electrode, the third sidewall, and the fourth sidewall as a mask, thereby forming second source and drain regions of the first conductivity type each in a region of the semiconductor layer located below a corresponding side of the fourth sidewall.

DETAILED DESCRIPTION OF THE PREFERRED EMBODIMENTS

Hereinafter, a semiconductor device and a fabrication method of the device according to an embodiment of the present invention will be described with reference to the accompanying drawings.

Figure 1:
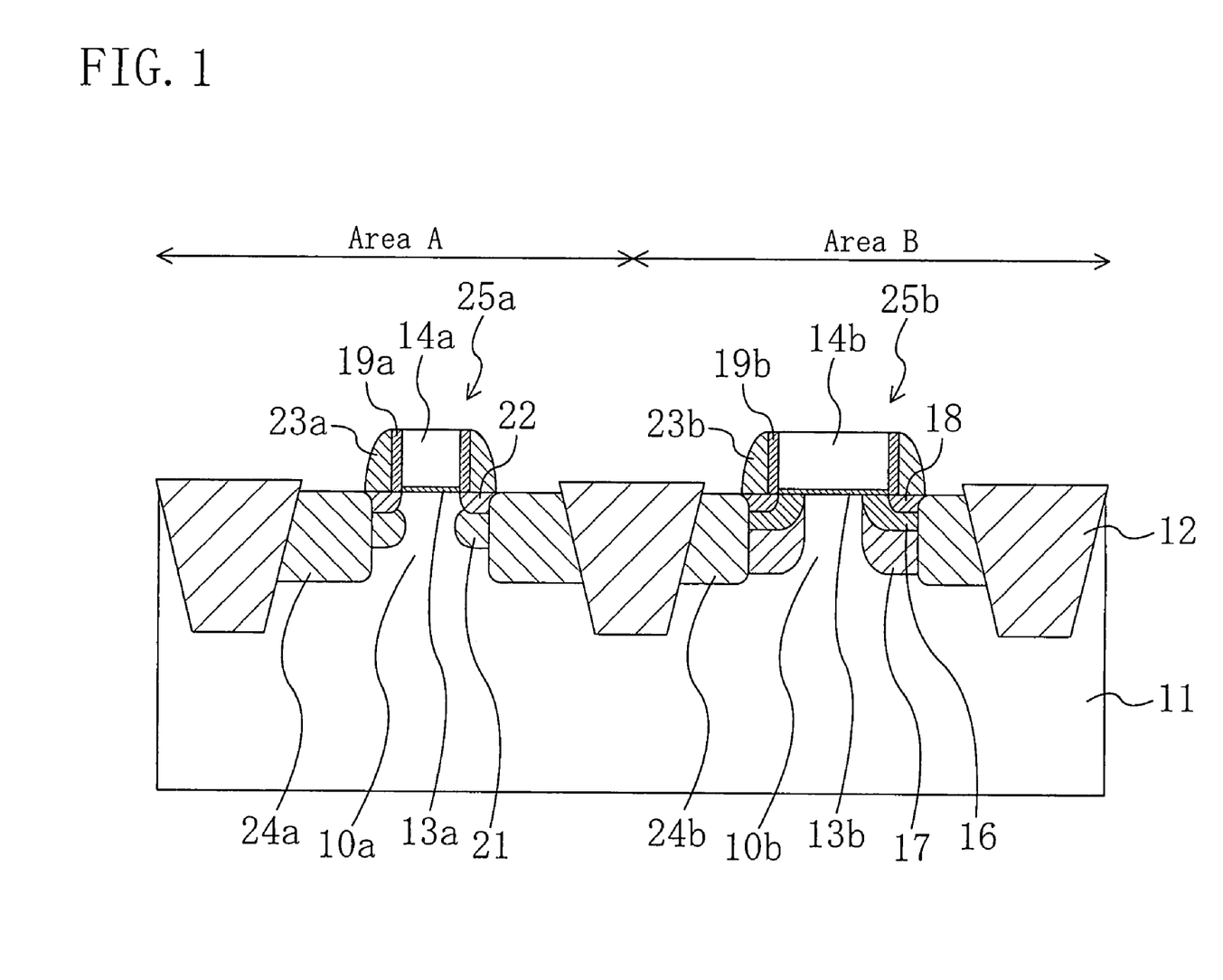
FIG. 1 is a sectional view showing the structure of a semiconductor device according to an embodiment of the present invention.

FIG. 1 is a sectional view showing the structure of a semiconductor device according to an embodiment of the present invention. In FIG. 1, an n-channel MIS transistor 25a for an internal circuit (internal MIS Tr 25a) is provided in an active region 10a of an internal circuit area AreaA illustrated in the left half of this figure, and an n-channel MIS transistor 25b for a peripheral circuit (peripheral MIS Tr 25b) is provided in an active region 10b of a peripheral circuit area AreaB illustrated in the right half of this figure. In a semiconductor region 11 which is part of a semiconductor substrate, regions surrounding the sides of the active regions 10a and 10b are formed with isolation regions 12 of shallow trench isolation (STI), respectively.

The internal MIS Tr 25a provided in the internal circuit area AreaA includes a gate insulating film 13a, a gate electrode 14a, first sidewalls 19a, second sidewalls 23a, n-type source and drain regions 24a, n-type extension regions (or n-type LDD regions) 22, and p-type pocket regions 21. The gate insulating film 13a is provided on the active region 10a of the p-type semiconductor region 11. The gate electrode 14a is provided on the gate insulating film 13a. The first sidewalls 19a of plate shapes are provided on side surfaces of the gate electrode 14a, respectively. The second sidewalls 23a are provided on the first sidewalls 19a, respectively. The n-type source and drain regions 24a are provided in regions of the active region 10a located below the outer sides of the second sidewalls 23a (the sides positioned in the direction from the gate electrode 14a toward the outside), respectively. The n-type extension regions 22 containing arsenic are provided in regions of the active region 10a interposed between the n-type source and drain regions 24a and located below the outer sides of the gate electrode 14a, respectively. The p-type pocket regions 21 made of boron-diffused layers are provided in regions of the active region 10a which are interposed between the n-type source and drain regions 24a and which are located below the outer sides of the gate electrode 14a and deeper than the n-type extension regions 22, respectively. The n-type extension regions 22 are formed to overlap edges of the gate electrode 14a. The bottom surfaces of the n-type extension regions 22 are covered with the p-type pocket regions 21 having a lower dopant concentration than the n-type extension region 22. The n-type source and drain regions 24a are provided to have a higher dopant concentration than the n-type extension region 22 and a greater diffusion depth than the p-type pocket region 21. Note that the first sidewalls 19a are offset sidewalls used as an implantation mask for forming the p-type pocket regions 21 and the n-type extension regions 22, and the second sidewalls 23a are used as an implantation mask for forming the n-type source and drain regions 24a.

On the other hands, the peripheral MIS Tr 25b provided in the peripheral circuit area AreaB includes a gate insulating film 13b, a gate electrode 14b, first sidewalls 19b, second sidewalls 23b, n-type source and drain regions 24b, nitrogen diffusion layers 18, n-type extension regions (or n-type LDD regions) 16, and n-type dopant regions 17. The gate insulating film 13b is provided on the active region 10b of the p-type semiconductor region 11. The gate electrode 14b is provided on the gate insulating film 13b. The first sidewalls 19b of plate shapes are provided on side surfaces of the gate electrode 14b, respectively. The second sidewalls 23b are provided on the first sidewalls 19b, respectively. The n-type source and drain regions 24b are provided in regions of the active region 10b located below the outer sides of the second sidewalls 23b, respectively. The nitrogen diffusion layers 18 are provided in regions of the active region 10b interposed between the n-type source and drain regions 24b and located below the outer sides of the gate electrode 14b, respectively. The n-type extension regions 16 containing arsenic are provided in regions of the active region 10b located below the outer sides of the gate electrode 14b so that the n-type extension regions 16 cover the inner (the side closer to the center of the gate electrode 14b) side surfaces and the bottom surfaces of the nitrogen diffusion layers 18, respectively. The n-type dopant regions 17 containing phosphorus are provided in regions of the active region 10b located below the outer sides of the gate electrode 14b and deeper than the n-type extension regions 16, respectively. The n-type dopant regions 17 are provided to have a lower dopant concentration than the n-type extension region 16 and a dopant profile whose tail portion is more gently curved than the n-type extension region 16. The nitrogen diffusion layers 18 are provided to have a higher dopant concentration and a smaller diffusion depth than the n-type extension region 16. The n-type source and drain regions 24b are provided to have a higher dopant concentration than the nitrogen diffusion layer 18 and a greater diffusion depth than the n-type dopant region 17. Note that the first sidewalls 19b are offset sidewalls used as an implantation mask for forming the nitrogen diffusion layers 18, the n-type extension regions 16, and the n-type dopant regions 17, and the second sidewalls 23b are used as an implantation mask for forming the n-type source and drain regions 24b.

Next, a method for fabricating a semiconductor device according to this embodiment will be described with reference to FIGS. 2A to 2F. FIGS. 2A to 2F are sectional views showing process steps of the method for fabricating a semiconductor device according to this embodiment of the present invention. In FIGS. 2A to 2F, the n-channel MIS transistor for an internal circuit (internal MIS Tr) is provided in the internal circuit area AreaA illustrated in the left halves of these figures, and the n-channel MIS transistor for a peripheral circuit (peripheral MIS Tr) is provided in the peripheral circuit area AreaB illustrated in the right halves of these figures.

Figure 2A:
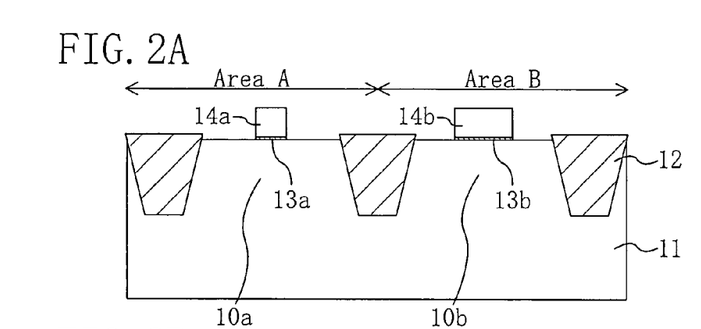
FIGS. 2A to 2F are sectional views showing process steps of a method for fabricating a semiconductor device according to the embodiment of the present invention.

In the method for fabricating a semiconductor device of this embodiment, first, in the step shown in FIG. 2A, in the p-type semiconductor region 11, the 300 nm-deep isolation regions 12 surrounding the sides of the active regions 10a and 10b are formed, respectively, by a normal shallow trench isolation process. Thereafter, the gate insulating film 13a of a silicon oxide film having a thickness of 2 nm and the gate electrode 14a of a polysilicon film having a gate length of 0.1 μm are formed above the active region 10a of the internal circuit area AreaA, while the gate insulating film 13b and the gate electrode 14b are formed above the active region 10b of the peripheral circuit area AreaB. Before the gate insulating films 13a and 13b are formed, the active region 10a of the internal circuit area AreaA and the active region 10b of the peripheral circuit area AreaB may be subjected to ion implantation for threshold value control.

Figure 2B:
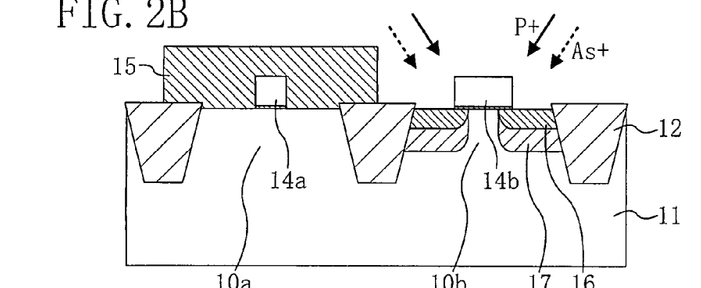

Next, in the step shown in FIG. 2B, on the substrate, an implantation mask 15 of photoresist is formed which covers the internal circuit area AreaA and has an opening in the peripheral circuit area AreaB. Thereafter, with the implantation mask 15 covering the internal circuit area AreaA, implantation of phosphorus ions serving as an n-type dopant is conducted by four times with a single rotation. This implantation is made using the gate electrode 14b as a mask and on an implantation condition of an acceleration energy of 45 KeV, a dose of $1.3 \times 10^{12}/cm^2$, and a tilt angle (the angle with respect to the normal to the substrate surface) of 38 degrees. Thereby, in regions of the active region 10b of the peripheral circuit area AreaB located below the both sides of the gate electrode 14b, the n-type dopant regions 17 are formed which are made of lightly-diffused phosphorus layers with a depth of 0.2 μm and a phosphorus concentration of about $5.2 \times 10^{17}$ atoms/cm$^3$. Subsequently, with the implantation mask 15 covering the internal circuit area AreaA, implantation of arsenic ions serving as an n-type dopant is conducted four times with a single rotation. This implantation is made using the gate electrode 14b as a mask and on an implantation condition of an acceleration energy of 45 KeV, a dose of $3.5 \times 10^{12}/cm^2$, and a tilt angle of 38 degrees. Thereby, in regions of the active region 10b of the peripheral circuit area AreaB located below the both sides of the gate electrode 14b, the n-type extension regions 16 are formed which are made of lightly-diffused arsenic layers with a depth of 0.17 μm and an arsenic concentration of about $1 \times 10^{18}$ atoms/cm$^3$. During this implantation, by implanting ions obliquely relative to the upper surface of the substrate, the n-type extension regions 16 are formed to extend inwardly from the portions of the active region 10b below the edges of the gate electrode 14b. Thus, the n-type extension regions 16 can overlap the gate electrode 14b while a channel region with a predetermined width is secured below the gate electrode 14b. In this step, either of implantation of phosphorus ions and implantation of arsenic ions may be conducted first. Although the phosphorus ions and the arsenic ions are implanted at the same tilt angle, these ions may be implanted at different tilt angles.

Figure 2C:
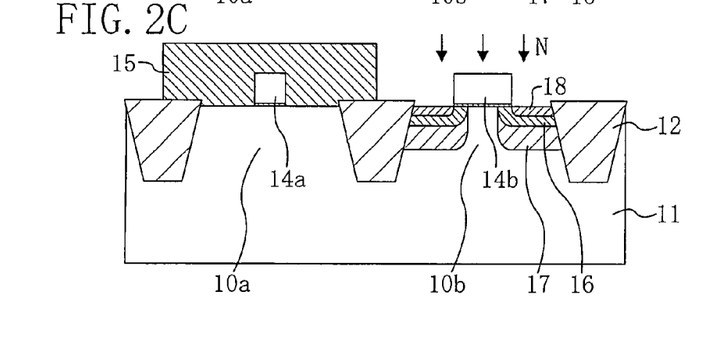

Then, in the step shown in FIG. 2C, with the implantation mask 15 covering the internal circuit area AreaA, nitrogen ions are implanted using the gate electrode 14b as a mask. This implantation is made on an implantation condition of an acceleration energy of 20 KeV, a dose of $2.0 \times 10^{15}/cm^2$, and a tilt angle of 0 degrees. Thereby, in regions of the active region 10b of the peripheral circuit area AreaB located below the both sides of the gate electrode 14b, the nitrogen diffusion layers 18 are formed which have a depth of 0.05 µm and a nitrogen concentration of about $1\times10^{19}$ atoms/cm$^3$. In this formation, the nitrogen diffusion layers 18 are formed at a smaller tilt angle and to have a smaller depth than the n-type extension region 16, whereby the nitrogen diffusion layers 18 are formed to be included within the n-type extension regions 16, respectively. Therefore, the bottom surface and the side surface of the nitrogen diffusion layer 18 other than the portion in contact with the isolation region 12 are shaped to be in contact with the n-type extension region 16. In this step, by implanting nitrogen ions for the nitrogen diffusion layer 18 after implantation of phosphorus ions for the n-type dopant region 17 and arsenic ions for the n-type extension region 16, the peak concentration and the overall concentration of nitrogen rise as compared with those of the conventional implantation such that phosphorus ions and arsenic ions are implanted after implantation of nitrogen ions. In this step, nitrogen is implanted at a tilt angle of 0 degrees, but the tilt angle may be another value as long as the tilt angle is smaller than those used for formations of the n-type extension region 16 and the n-type dopant region. This is because even in such a case, the formed nitrogen diffusion layer 18 is contained within the n-type extension region 16.

Figure 2D:
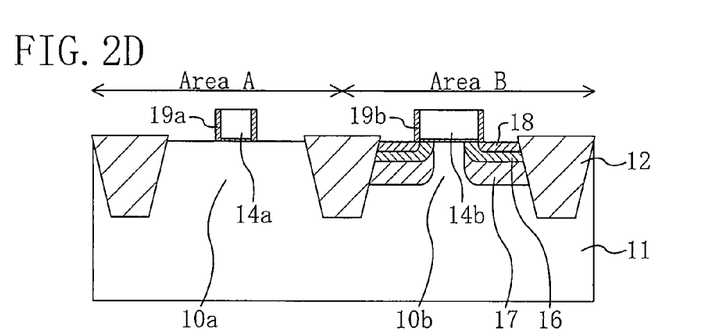

Subsequently, in the step shown in FIG. 2D, the implantation mask 15 is removed, and then a silicon oxide film (not shown) with a thickness of 13 nm is formed on the substrate. Thereafter, the silicon oxide film is etched back to form the first sidewalls 19a of plate shapes on the side surfaces of the gate electrode 14a in the internal circuit area AreaA and the first sidewalls 19b of plate shapes on the side surfaces of the gate electrode 14b in the peripheral circuit area AreaB.

Figure 2E:
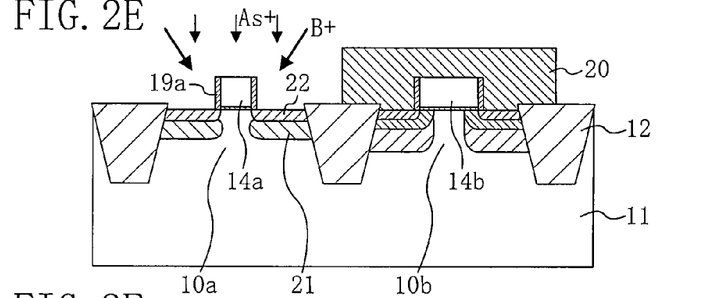

Next, in the step shown in FIG. 2E, on the substrate, an implantation mask 20 of photoresist is formed which covers the peripheral circuit area AreaB and has an opening in the internal circuit area AreaA. Thereafter, with the implantation mask 20 covering the peripheral circuit area AreaB, implantation of arsenic ions serving as an n-type dopant is conducted four times with a single rotation. This implantation is made using the gate electrode 14a and the first sidewalls 19a as a mask and on an implantation condition of an acceleration energy of 5 KeV, a dose of $2.0\times10^{14}$/cm$^2$, and a tilt angle of 0 degrees. Thereby, in regions of the active region 10a of the internal circuit area AreaA located below sides of the both first sidewalls 19a, the n-type extension regions 22 are formed which are made of lightly-diffused arsenic layers with a depth of 0.05 µm and an arsenic concentration of about $1\times10^{19}$ atoms/cm$^3$. During this implantation, implantation of arsenic ions can be conducted four times with a single rotation to make the plan dopant profile symmetric. Subsequently, with the implantation mask 20 covering the peripheral circuit area AreaB, implantation of boron ions serving as a p-type dopant is conducted four times with a single rotation. This implantation is made using the gate electrode 14a and the first sidewalls 19a as a mask and on an implantation condition of an acceleration energy of 12 KeV, a dose of $7.0\times10^{12}$/cm$^2$, and a tilt angle of 25 degrees. Thereby, in regions of the active region 10a of the internal circuit area AreaA located below the sides of the both first sidewalls 19a, the p-type pocket regions 21 are formed which are made of boron diffusion layers with a depth of 0.2 µm and a boron concentration of about $2.8\times10^{18}$ atoms/cm$^3$. Thus, the tilt angle used for formation of the p-type pocket regions 21 is greater than the tilt angle used for formation of the n-type extension region 22, whereby the p-type pocket region 21 can be formed to enter a region of the active region 10a located below the gate electrode 14a deeper than the n-type extension region 22.

Figure 2F:
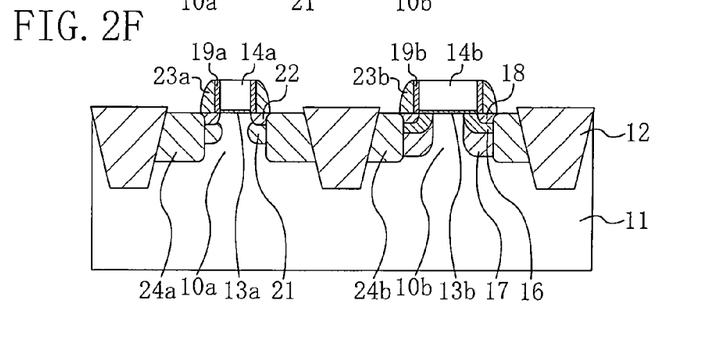

Subsequently, in the step shown in FIG. 2F, the implantation mask 20 is removed, and then a silicon nitride film with a thickness of 60 nm is formed on the substrate. Thereafter, the silicon nitride film is etched back to form the second sidewalls 23a on the first sidewalls 19a provided on the side surfaces of the gate electrode 14a of the internal circuit area AreaA and the second sidewalls 23b on the first sidewalls 19b provided on the side surfaces of the gate electrode 14b of the peripheral circuit area AreaB. Then, an n-type dopant is implanted from above the substrate. Thereby, in the internal circuit area AreaA, the gate electrode 14a, the first sidewalls 19a, and the second sidewalls 23a are used as a mask, and thus the n-type source and drain regions 24a with a depth of 0.25 µm and an n-type dopant concentration of about $5\times10^{19}$ atoms/cm$^3$ are formed in portions of the active region 10a located below sides of the second sidewalls 23a, respectively. Simultaneously, in the peripheral circuit area AreaB, the gate electrode 14b, the first sidewalls 19b, and the second sidewalls 23b are used as a mask, and thus the n-type source and drain regions 24b with a depth of 0.25 µm and an n-type dopant concentration of about $5\times10^{19}$ atoms/cm$^3$ are formed in portions of the active region 10b located below sides of the second sidewalls 23b, respectively. In this step, the n-type source and drain regions 24a and 24b are formed in the following manner. First, arsenic ions are implanted on an implantation condition of an acceleration energy of 20 KeV, a dose of $3.0\times10^{14}$/cm$^2$, and a tilt angle of 7 degrees, and successively implantation of arsenic ions is conducted four times with a single rotation on an implantation condition of an acceleration energy of 50 KeV, a dose of $1.25\times10^{15}$/cm$^2$, and a tilt angle of 7 degrees. Successively, phosphorus ions are implanted on an implantation condition of an acceleration energy of 40 KeV, a dose of $2.5\times10^{12}$/cm$^2$, and a tilt angle of 7 degrees to form the n-type source and drain regions 24a and 24b. By the process steps described above, the semiconductor device of the present invention is fabricated.

Figure 3:
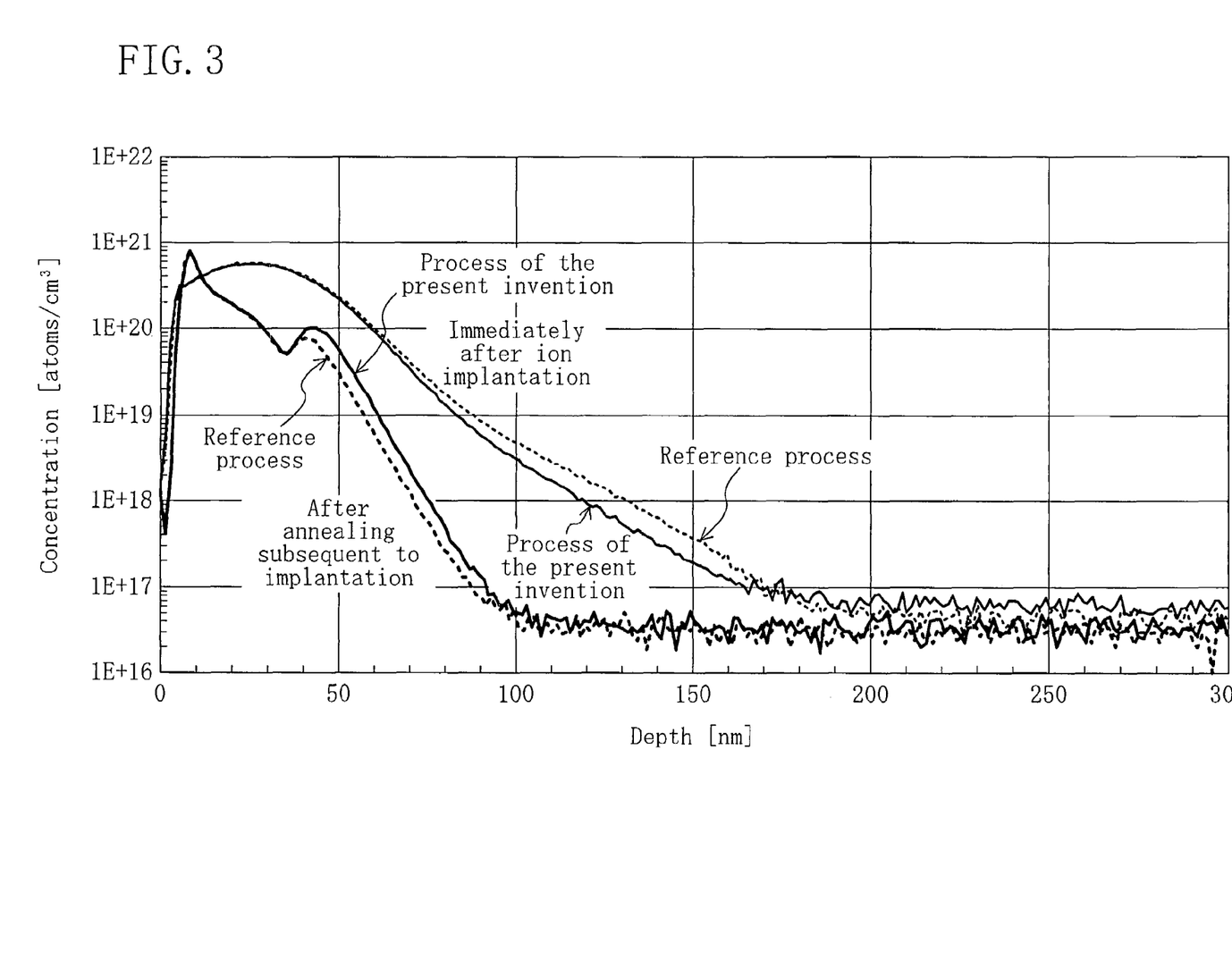
FIG. 3 is a graph illustrating the results obtained by measuring nitrogen profiles before and after annealing in processes that differ in the sequence of implantation of phosphorus ions, arsenic ions, and nitrogen ions.

In this embodiment, the nitrogen diffusion layer 18 can be provided to improve the hot carrier lifetime of the device. In particular, implantation of nitrogen ions for the nitrogen diffusion layer 18 is conducted after implantation of phosphorus ions for the n-type dopant region 17 and arsenic ions for the n-type extension region 16, whereby the occurrence of hot carriers can be suppressed effectively. Hereinafter, the results of measurements of this phenomenon will be shown. FIG. 3 is a graph illustrating the results obtained by measuring nitrogen profiles before and after annealing in processes that differ in the sequence of implantation of phosphorus ions, arsenic ions, and nitrogen ions. In FIG. 3, the solid curves show nitride profiles of the nitrogen diffusion layer 18 formed by implanting nitrogen ions after implantation of phosphorus ions and arsenic ions (referred to as the process of the present invention), and the broken curves show nitride profiles made by implanting phosphorus ions and arsenic ions after implantation of nitrogen ions (referred to as the reference process). In both the processes, annealing was performed after implantations of three types (phosphorus, arsenic, nitrogen) of ions, and the nitrogen profiles before and after the annealing were measured.

As shown in FIG. 3, immediately after the ion implantation, there is no difference in the peak concentration of nitrogen between the two processes. However, after the annealing subsequent to the implantation, the peak concentration of nitrogen of the process of the present invention ($1 \times 10^{20}$ atoms/cm$^3$) is higher than that of the reference process ($8 \times 10^{19}$ atoms/cm$^3$), and the overall concentration, other than the peak concentration, of the process of the present invention is also higher than that of the reference process. In FIG. 3, in each of the two processes, the nitrogen profile after the annealing subsequent to the implantation has two peaks. Of the two peaks, the peak closer to the y-axis is obtained in the gate insulating film, while the peak far from the y-axis is obtained in the semiconductor layer. Therefore, in this figure, the value of the peak far from the y-axis is used as the value of the peak concentration of the nitrogen diffusion layer 18.

As mentioned above, with this embodiment, the peak concentration and the overall concentration of nitrogen can be raised without increasing the dose of nitrogen to be implanted. Typically, if the dose of nitrogen is increased, an increase of junction leakage or other drawbacks would occur. However, in this embodiment, the dose of nitrogen to be implanted does not have to be increased, so that such drawbacks never occur.

Figure 4:
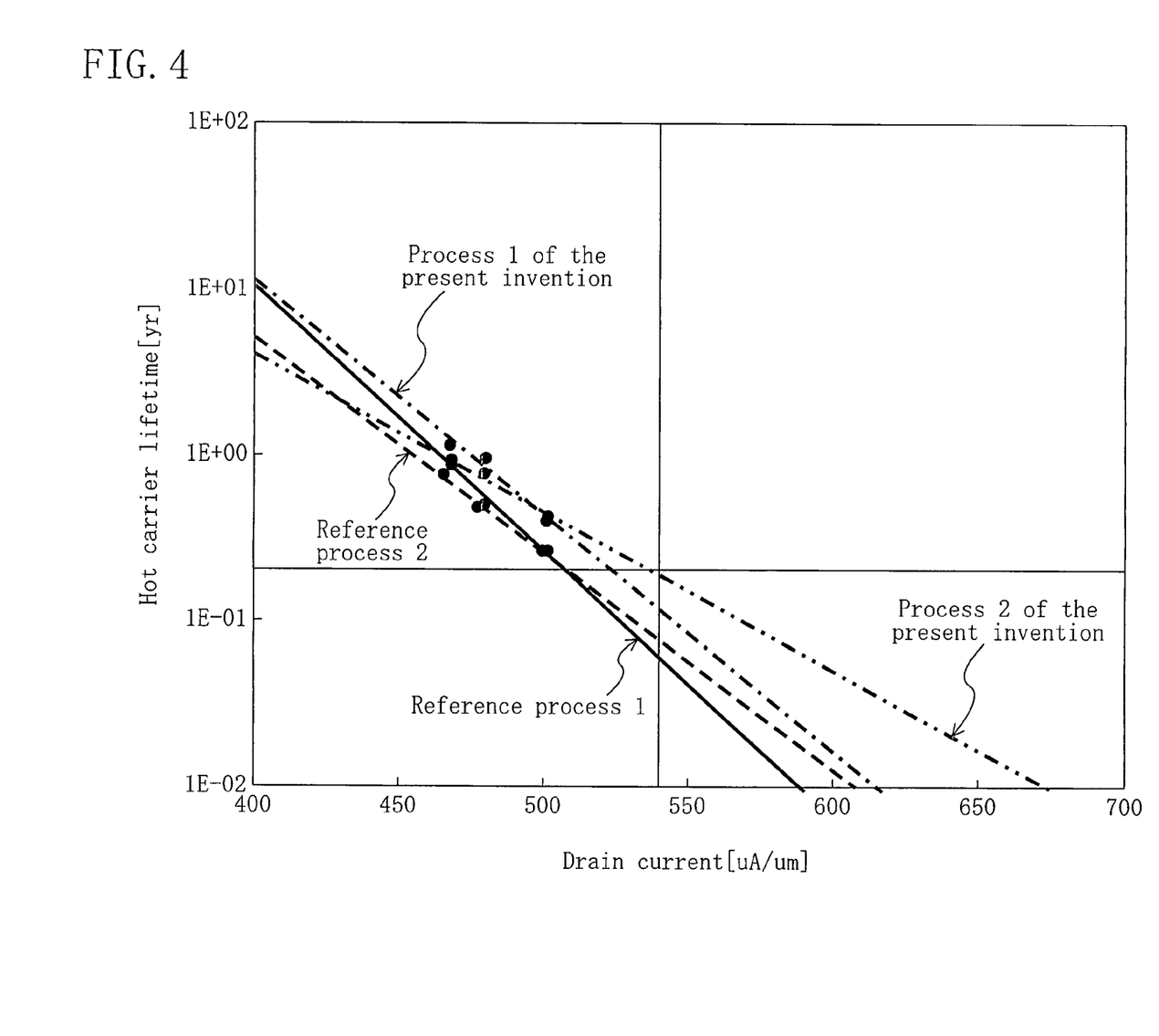
FIG. 4 is a graph showing the relations between the hot carrier lifetime and the drain current in a process of the present invention and a reference process.

FIG. 4 is a graph showing the relations between the hot carrier lifetime and the drain current in the process of the present invention and the reference process. FIG. 4 plots the value of the drain current in abscissa and the value of the hot carrier lifetime in ordinate. In FIG. 4, similarly to FIG. 3, the reference process 1 and the reference process 2 represent hot carrier lifetimes of the case where phosphorus ions and arsenic ions are implanted after implantation of nitrogen ions, and the process 1 of the present invention and the process 2 of the present invention represent hot carrier lifetimes of the case where nitrogen ions are implanted after implantation of phosphorus ions and arsenic ions. In this description, the hot carrier lifetime indicates the period of time during which the drain current decreases from the initial value by 10% while the transistor continues to be driven. The measurements are made using two ion implantation apparatuses. The measurement results of the reference process 1 and the process 1 of the present invention are obtained by ion implantation by a first ion implantation apparatus, while the measurement results of the reference process 2 and the process 2 of the present invention are obtained by ion implantation by a second ion implantation apparatus.

In the graph shown in FIG. 4, the hot carrier lifetime is expected by comparing the values of hot carrier lifetimes of the respective processes when the drain current is 540 μA. This expectation is made by comparing the values of the hot carrier lifetimes in the case where a drain current flows during operation of the element. When the drain current is 540 μA, the hot carrier lifetimes decrease in the order of the process 2 of the present invention, the process 1 of the present invention, the reference process 2, and the reference process 1. From this, it is found that regardless of the first and second ion implantation apparatuses, the process of the present invention has an improved hot carrier lifetime as compared with the reference process. This is probably because the process of the present invention can have a higher nitrogen concentration around the interface between the semiconductor layer and the gate insulating film than the reference process and thus, in the process of the present invention, nitrogen ions acting as acceptors increase to improve the hot carrier lifetime.

As described above, in this embodiment, nitrogen ions for the nitrogen diffusion layer 18 are implanted after implantation of phosphorus ions for the n-type dopant region 17 and arsenic ions for the n-type extension region 16, whereby the peak concentration and the overall concentration of nitrogen can be raised in the nitrogen diffusion layer 18. With this method, the peak concentration of nitrogen can be raised without increasing the amount of nitrogen to be implanted into the semiconductor layer, so that more hot carriers can be suppressed without increasing influences of nitrogen on the element or the like. Moreover, provision of the n-type dopant region 17 can smooth a pn junction in the portion of the active region 10b located below the gate electrode 14b. This further suppresses the occurrence of hot carriers.

In this embodiment, description has been made of the case where the present invention improves the hot carrier lifetime of the peripheral circuit area AreaB, but the present invention is applicable to a MISFET provided in another region such as the internal circuit area AreaA. For example, in the case where the present invention is employed for the internal circuit area AreaA, the pocket regions 21 as shown in FIG. 1 are not provided. Alternatively, it is sufficient that nitrogen diffusion layers (not shown) are provided in the n-type extension regions 22 containing arsenic ions, respectively, and that in addition, lightly-doped n-type regions (not shown) containing phosphorus ions are provided in regions of the semiconductor region 11 located below the n-type extension regions 22, respectively.

What is claimed is:

1. A semiconductor device having a first MIS transistor provided in a semiconductor layer,
   wherein the first MIS transistor comprises:
   a first gate insulating film provided on the semiconductor layer;
   a first gate electrode provided on the first gate insulating film;
   first extension regions containing a first dopant of a first conductivity type and provided in regions of the semiconductor layer located below sides of the first gate electrode, respectively;
   dopant regions containing a second dopant of the first conductivity type and provided in regions of the semiconductor layer located below the sides of the first gate electrode and deeper than the first extension region, respectively; and
   nitrogen diffusion layers provided on the first extension regions and in an upper surface portion of the semiconductor layer, respectively,
   wherein in the nitrogen diffusion layers, their entire bottom surface and their side surface closer to the first gate electrode are surrounded by the first extension region and located within surface boundaries thereof, respectively.

2. The device of claim 1, further comprising:
   a sidewall provided on each side surface of the first gate electrode; and
   source and drain regions containing a third dopant of the first conductivity type and each provided in a region of the semiconductor layer located below a corresponding side of the sidewall,
   wherein the nitrogen diffusion layers are each provided in a region of the upper surface portion of the semiconductor layer located below the sidewall.

3. The device of claim 2,
   wherein the sidewall comprises: a first sidewall provided on a corresponding side surface of the first gate electrode; and a second sidewall provided to the corresponding side surface of the first gate electrode with the first sidewall interposed therebetween.

4. The device of claim 1,
wherein the first dopant is arsenic, and
the second dopant is phosphorus.

5. The device of claim 1,
wherein a second MIS transistor is provided in a region of the semiconductor layer differing from the region where the first MIS transistor is provided, and
the second MIS transistor comprises:
a second gate insulating film provided on the semiconductor layer;
a second gate electrode provided on the second gate insulating film;
second extension regions containing a fourth dopant of the first conductivity type and provided in regions of the semiconductor layer located below sides of the second gate electrode, respectively; and
pocket regions containing a dopant of a second conductivity type and provided in regions of the semiconductor layer located below the sides of the second gate electrode and deeper than the second extension regions, respectively.

6. The device of claim 5, further comprising:
a third sidewall provided on a corresponding side surface of the second gate electrode;
a fourth sidewall provided to the corresponding side surface of the second gate electrode with the third sidewall interposed therebetween; and
second source and drain regions containing a fifth dopant of the first conductivity type and each provided in a region of the semiconductor layer located below a corresponding side of the fourth sidewall.

7. The device of claim 5,
wherein the second MIS transistor has no layer containing nitrogen on the second extension regions.

8. A semiconductor device having a first MIS transistor provided in a semiconductor layer,
wherein the first MIS transistor comprises:
a first gate insulating film provided on the semiconductor layer;
a first gate electrode provided on the first gate insulating film;
first extension regions containing a first dopant of a first conductivity type and provided in regions of the semiconductor layer located below sides of the first gate electrode, respectively;
dopant regions containing a second dopant of the first conductivity type and provided in regions of the semiconductor layer located below the sides of the first gate electrode and deeper than the first extension region, respectively;
nitrogen diffusion layers provided on the first extension regions and in an upper surface portion of the semiconductor layer, respectively;
a sidewall provided on each side surface of the first gate electrode; and
source and drain regions containing a third dopant of the first conductivity type and each provided in a region of the semiconductor layer located below a corresponding side of the sidewall,
wherein the sidewall comprises: a first sidewall provided on a corresponding side surface of the first gate electrode; and a second sidewall provided to the corresponding side surface of the first gate electrode with the first sidewall interposed therebetween.

9. The device of claim 8,
wherein the first dopant is arsenic, and
the second dopant is phosphorus.

10. The device of claim 8,
wherein a second MIS transistor is provided in a region of the semiconductor layer differing from the region where the first MIS transistor is provided, and
the second MIS transistor comprises:
a second gate insulating film provided on the semiconductor layer;
a second gate electrode provided on the second gate insulating film;
second extension regions containing a fourth dopant of the first conductivity type and provided in regions of the semiconductor layer located below sides of the second gate electrode, respectively; and
pocket regions containing a dopant of a second conductivity type and provided in regions of the semiconductor layer located below the sides of the second gate electrode and deeper than the second extension regions, respectively.

11. The device of claim 10, further comprising:
a third sidewall provided on a corresponding side surface of the second gate electrode;
a fourth sidewall provided to the corresponding side surface of the second gate electrode with the third sidewall interposed therebetween; and
second source and drain regions containing a fifth dopant of the first conductivity type and each provided in a region of the semiconductor layer located below a corresponding side of the fourth sidewall.

12. The device of claim 10,
wherein the second MIS transistor has no layer containing nitrogen on the second extension regions.

13. A semiconductor device having a first MIS transistor provided in a semiconductor layer,
wherein the first MIS transistor comprises:
a first gate insulating film provided on the semiconductor layer;
a first gate electrode provided on the first gate insulating film;
first extension regions containing a first dopant of a first conductivity type and provided in regions of the semiconductor layer located below sides of the first gate electrode, respectively;
dopant regions containing a second dopant of the first conductivity type and provided in regions of the semiconductor layer located below the sides of the first gate electrode and deeper than the first extension region, respectively; and
nitrogen diffusion layers provided on the first extension regions and in an upper surface portion of the semiconductor layer, respectively,
wherein a second MIS transistor is provided in a region of the semiconductor layer differing from the region where the first MIS transistor is provided, and
the second MIS transistor comprises:
a second gate insulating film provided on the semiconductor layer;
a second gate electrode provided on the second gate insulating film;
second extension regions containing a fourth dopant of the first conductivity type and provided in regions of the semiconductor layer located below sides of the second gate electrode, respectively; and
pocket regions containing a dopant of a second conductivity type and provided in regions of the semiconductor layer located below the sides of the second gate electrode and deeper than the second extension regions, respectively.

14. The device of claim 13, further comprising:
a sidewall provided on each side surface of the first gate electrode; and
source and drain regions containing a third dopant of the first conductivity type and each provided in a region of the semiconductor layer located below a corresponding side of the sidewall,
wherein the nitrogen diffusion layers are each provided in a region of the upper surface portion of the semiconductor layer located below the sidewall.

15. The device of claim 14,
wherein the sidewall comprises: a first sidewall provided on a corresponding side surface of the first gate electrode; and a second sidewall provided to the corresponding side surface of the first gate electrode with the first sidewall interposed therebetween.

16. The device of claim 13,
wherein the first dopant is arsenic, and
the second dopant is phosphorus.

17. The device of claim 13, further comprising:
a third sidewall provided on a corresponding side surface of the second gate electrode;
a fourth sidewall provided to the corresponding side surface of the second gate electrode with the third sidewall interposed therebetween; and
second source and drain regions containing a fifth dopant of the first conductivity type and each provided in a region of the semiconductor layer located below a corresponding side of the fourth sidewall.

18. The device of claim 13,
wherein the second MIS transistor has no layer containing nitrogen on the second extension regions.

* * * * *